United States Patent [19]
Kub

[11] Patent Number: 5,208,477
[45] Date of Patent: May 4, 1993

[54] RESISTIVE GATE MAGNETIC FIELD SENSOR

[75] Inventor: Francis J. Kub, Arnold, Md.

[73] Assignee: The United States of America as represented by the Secretary of the Navy, Washington, D.C.

[21] Appl. No.: 636,348

[22] Filed: Dec. 31, 1990

[51] Int. Cl.$^5$ .......................................... H01L 27/22
[52] U.S. Cl. .................................. 257/421; 257/427
[58] Field of Search ............... 357/27, 23.5, 41, 23.14, 357/25; 307/309; 257/421, 427, 365

[56] References Cited

U.S. PATENT DOCUMENTS

| | | | |
|---|---|---|---|
| 3,714,522 | 1/1973 | Komiya et al. | 357/30 |
| 3,714,523 | 1/1973 | Bate | 357/23.14 |
| 3,829,883 | 8/1974 | Bate | 357/27 |
| 3,836,993 | 9/1974 | Joshi | 357/27 |
| 3,968,452 | 7/1976 | Sahara et al. | 357/23.14 |
| 4,028,718 | 6/1977 | Migitaka et al. | 357/27 |
| 4,129,880 | 12/1978 | Vinal | 357/27 |
| 4,163,986 | 8/1979 | Vinal | 357/27 |
| 4,490,734 | 12/1984 | Yamada | 357/23.14 |
| 4,590,506 | 5/1986 | Esser | 357/23.14 |
| 4,831,427 | 5/1989 | Coleman, Jr. | 357/27 |
| 4,894,689 | 1/1990 | Cooper, Jr. et al. | 357/23.14 |
| 5,083,174 | 1/1992 | Kub | 357/23.5 |

OTHER PUBLICATIONS

Gill et al., "a Magnetic Field Sensor Using A Graded Gate Potential", Solid State Devices, pp. 523-526, 1988.
Popovic, "A MOS Hall Device Free From Short Circuit Effect", Sensors and Actuators, 5(1984), 253-262.
Song et al., "Characterization of Evaporated Cr-SiO Cermet Films for Resistive-Gate CCD Applications", IEEE Trans. on Elec. Devices, vol. 36, No. 9, Sep. 1989.
Yin et al., "Negative transconductance in a resistive gate metal semiconductor field effect transistor", Appl. Phys. Lett. 54(19), May 8, 1989.
Hu et al., "A Resistive Gate IGFET Tetrode", IEEE Transactions on Electron Devices, vol. ED-18, No. 7, Jul. 1971.
Collins, "Hall effect device feedback circuit", IBM Tech. Disc. Bull, vol. 13, No. 8, Jan. 1971.
Arnett et al., "Two-Drain FET Magnetic Field Sensor", IBM Tech. Disc. Bull., vol. 13, No. 12, May 1971.
Freeman et al., "Semiconductor Magnetic Field Sensor", IBM Tech. Dis. Bull., vol. 18, No. 5, Oct. 1975.

*Primary Examiner*—Rolf Hille
*Assistant Examiner*—Minhloan Tran
*Attorney, Agent, or Firm*—Thomas E. McDonnell; George Jameson

[57] ABSTRACT

A FET device for sensing a magnetic field, the FET device comprising: a semiconductor material having a source at a first position therein and receiving means at a second position therein for receiving charge carriers; bias voltage means for providing a bias voltage between the source and the receiving means to produce a movement of charge carriers between the source and the receiving means; a channel layer disposed within the semiconductor material between the source and the receiving means through which the charge carriers move as a function of the bias voltage and the magnetic field being sensed; a resistive gate disposed between the source and the receiving means and above the channel layer; a first resistive gate contact disposed in a first preselected position with respect to the source; a second resistive gate contact disposed in a second preselected position with respect to the receiving means; a resistive gate voltage means for providing a resistive gate bias voltage between the first and second resistive gate contacts to establish a longitudinal electric field in the channel layer; and output means disposed in the semiconductor material for providing a signal related to the strength of the magnetic field sensed by the FET device.

22 Claims, 3 Drawing Sheets

RESISTIVE GATE MAGNETIC FIELD SENSOR

FIELD OF THE INVENTION

The present invention relates to Field Effect Transistor (FET) magnetic field sensors in general and, more particularly, to Metal Insulator-Semiconductor-Field-Effect (MISFET) and Metal Epitaxial Semiconductor Field Effect Transistor (MESFET) magentic field sensors having a resistive gate.

BACKGROUND OF THE INVENTION

A conventional method of implementing a magnetic field sensor is to use a MOSFET semiconductor device comprising a source, a drain, and a gate, located between the source and the drain, which provides a control of charge carrier movement in a channel region between the source and drain. One common MOSFET device for sensing a magnetic field (sometimes referred to as a MAGFET) is the MOSFET Hall effect sensor which uses the basic MOSFET structure with Hall electrodes applied on either side of the channel so as to measure a voltage between the electrodes developed by the charge carrier movement in the channel. Another technique of implementing a MOSFET magnetic field sensor is to use split drains in a conventional MOSFET structure that includes a source and a gate.

In both types of known devices, the Lorentz deflection of charge carriers caused by a magnetic field perpendicular to the top surface of the MOSFET is used to sense the magnetic field strength. The deflection of carriers in the y-direction, for example, is proportional to the carrier velocity in the x-direction times the magnitude of the magnetic field in the z-direction. In the MOSFET Hall effect sensor, this deflection causes a change in voltage at the Hall electrodes, while in the split drain device, the deflection causes a differential change in the current at the output of the split drains.

The carrier deflection in the y-direction is a function of the electric field in the y-direction, $E_Y$, which is given by:

$$E_Y = k_H \mu B_Z E_X \tag{1}$$

where $k_H$ is the Hall coefficient, $\mu$ is the carrier mobility, $B_Z$ is the magnitude or strength of the magnetic field in the z-direction and $E_X$ is the longitudinal electric field in the x-direction.

One adverse factor affecting the use of a MOSFET as a magnetic field sensor is the associated undesirable noise sources that affect the sensitivity of the device. Examples of this include the "Johnson noise" produced by a circuit resistor, such as a load resistor or a bias resistor in the sensor circuitry, and signal noise of the receiver used with the sensor. Studies have been conducted in these areas with a view towards improving sensitivity. In my companion application Ser. No. 07/560,700, filed Jul. 31, 1990 and entitled "A Floating Gate Magnetic Field Sensor", an improved MOSFET sensor is described that offers increased sensitivity and combats the effect of noise sources typically associated with the load and bias resistances and with the sensor receiver.

However, in addition to noise considerations, carrier density has also been found to be a significant factor in the effectiveness of a MOSFET when used as a magnetic field sensor, as is evident from the following brief review of the basic MOSFET operation.

MOSFET devices operate in general in either a pentode or a triode mode. In the pentode mode, the channel (or gate) is pinched-off near the drain, and the region of high electric field is in the region from the pinch-off point to the drain. Thus, only a small region of the channel, i.e., the gate of the MOSFET, has a high electric field and, as can be observed from equation (1), the majority of the deflection will occur in the region near the drain. In the triode mode, a uniform longitudinal electric field, $E_X$, will exist in the channel with a value given by:

$$E_x = \frac{V_D}{L} \tag{2}$$

where $V_D$ is the drain voltage and L is the channel length. However, the condition for triode operation requires that:

$$V_G - V_t \gg V_D \tag{3}$$

where $V_G$ is the gate voltage, $V_D$ is the drain voltage and $V_t$ is the threshold voltage. The requirement for a large gate voltage $V_G$ means that a large carrier density will exist in the channel since the carrier density per unit area, n, at the source is a function of $V_G$, namely:

$$n = C_{OX}(V_G - V_t) \tag{4}$$

where $C_{OX}$ is the oxide capacitance.

A low carrier density in the channel for a MOSFET used as a magnetic field sensor is important for two reasons. First, the mean-square thermal noise current at the drain of a MOSFET, $\overline{I^2_n}$, depends on the carrier density n according to the relation:

$$\overline{I_n^2} = \frac{4KTW\mu}{L^2} \int_o^L e\, n(x)dx \tag{5}$$

where e is the charge of an electron, $=1.6 \times 10^{-19}$ coulombs, K is the Boltzman's constant, T is absolute temperature, W is the width of the MOSFET gate and $\mu$ is mobility of the charge carriers. Thus, a smaller carrier density results in a smaller noise current.

Secondly, an important parameter for the performance of a MOSFET as a magnetic field sensor is relative sensitivity, $S_r$, of the device, which can be expressed as follows:

$$S_r = \frac{E_y}{J_x} = \frac{k_H B_z}{e\, n} \tag{6}$$

where the symbols are as indicated earlier, and with $J_X$ = current density in the x-direction. Thus, a smaller carrier density yields an improvement in relative sensitivity of the MOSFET. The MOSFET sensitivity relationship is more fully discussed in an article entitled "A MOS Hall Device Free from Short-Circuit Effect," by R. S. Popovic, *Sensors and Activators*, Vol. 5, pp. 253-262 (1984).

The disadvantages discussed above in connection with large carrier densities associated with the use of a MOSFET as sensor device have limited its applicability. In particular, the large gate voltage heretofore required and the associated larger carrier density continue to restrict the sensitivity, and hence the effectiveness, of this type of sensor.

One approach to controlling carrier density is described in a publication entitled "A Magnetic Field Sensor Using A Graded Gate Potential" by D. S. Gill et al., *Solid State Devices*, at pages 523–526 (1988). The article describes the fabrication of a MOSFET-like structure, termed a Graded-gate FET (GFET), having a resistive gate made of undoped polysilicon, and diffused gate contacts at either end of the device. The gate contacts are biased separately so that a resulting voltage gradient is produced along the gate so as to provide a uniform longitudinal electric field that varies linearly along the entire length of the channel. The separation between diffused gate contacts is approximately 100 $\mu$m. Carrier collection is accomplished by relatively long (approximately 60 $\mu$m) lateral drain contacts. The article describes results with respect to both dual drain and triple drain GFET devices and based on the results, these devices appear to exhibit significantly better sensitivities than corresponding MAGFET devices.

The drain contacts used in the GFET described in the Gill et al. article are, as stated, located along the channel, and serve to increase the area over which carrier collection can take place, while preventing the development of a Hall electric field so that the charge collection, i.e. sensitivity of the device, is, based solely on carrier deflection. The application of a magnetic field perpendicular to the current flow through the channel produces an imbalance, or an asymmetry, in the two drain currents produced by the collection of charge carriers under each of the split drains, which provides an output as a measure of the strength of the magnetic field. The results described in the article indicate that the maximum measured sensitivity of the GFET device using a differential bias, delta $V_G$, on the gate of approximately +19 volts which is a factor of 5 greater than that obtained with delta $V_G = 0$.

It is noted that the triple drain GFET structure described collects undeflected charge carriers in a central drain region, and difficulties are acknowledged in the article in establishing a balanced current between the lateral drains from which the magnetic field measurement is made, thus indicating that the triple drain GFET structure may be impractical in the form described.

While the GFET device described in the above-referenced article provides a uniform longitudinal electric field along the entire length of the channel for increasing of sensitivity of the device, the device has certain disadvantages. For example, a distance of approximately 100 $\mu$m, is required between gate contacts with the channel length being on the order of 40 $\mu$m and the split drain length being 60 $\mu$m. The longitudinal electric field $E_X$ in the GFET device is given by:

$$E_X = \Delta V_G / L_G \qquad (7)$$

where $\Delta V_G$ is the bias voltage difference between the gate contacts and $L_G$ is the separation between the gate contacts. In accordance with equation (7), increasing the gate contact separation reduces the longitudinal electric field $E_X$. This affects the amount of carrier deflection, i.e. the sensitivity of the device, which is directly proportional to the longitudinal electric field, as shown by equation (1). For a large separation between gate contacts, a higher differential gate voltage must therefore be applied to maintain the same electric field within the channel.

SUMMARY OF THE INVENTION

The disadvantages of the prior art MOSFET magnetic field sensors discussed above, as well as other disadvantages, are overcome by the magnet field sensors MISFET device of the invention.

The MISFET device of the invention comprises a buried channel conducting layer having a source at a first end of the buried channel conducting layer, and a drain at an opposite second end of the buried channel conducting layer, with the drain comprising a first drain having a first output, and a second drain having a second output, the first and second drains being separated by a charge splitter. The MOSFET device further comprises bias voltage means for providing a bias voltage producing movement of charge carriers between the source and the drain, within a buried channel conducting layer located within the silicon substrate material. The channel layer, in accordance with one aspect of the invention comprises a buried channel conducting layer formed in silicon material, while in another implementation, the channel layer is formed in a gallium arsenide based material. A resistive gate means comprising a layer of polysilicon, is disposed on a silicon dioxide layer that is located above the buried channel conducting layer between the source and the drain, and resistive gate bias voltages ar provided to establish a longitudinal electric field within the buried channel conducting layer. In one implementaton, the source and drain regions are self-aligned to the contacts to the polysilicon resistive gate by using a high energy implant process. An output means is connected to the MOSFET device that produces an output signal related to the strength of the magnetic field. In accordance with one aspect of the invention, the output means is connected to the first and second drains of the MOSFET device, and comprises, for example, a source-follower load device.

In an alternative embodiment, a MOSFET having a source, a drain, a channel layer and resistive gate means includes an output means comprising electrode means positioned at two sides of the resistive gate means, for producing voltage signals as a function of the magnetic field. The longitudinal electric field within the buried channel conducting layer of the MOSFET device preferably varies substantially linearly across the resistive gate means. In one embodiment, the buried channel conducting layer comprises a P-type substrate with a N-type surface layer formed with a low dose implant of phosphorous or arsenic, and the source and the drain comprise N-type material, while the polysilicon layer may comprise a layer of undoped or lightly doped polysilicon.

The foregoing and other advantages of the invention will be more readily understood upon consideration of the following detailed description of the preferred embodiments of the invention, taken together with the accompanying drawings.

DETAILED DESCRIPTION OF THE PREFERRED EMBODIMENTS

Figure 1:
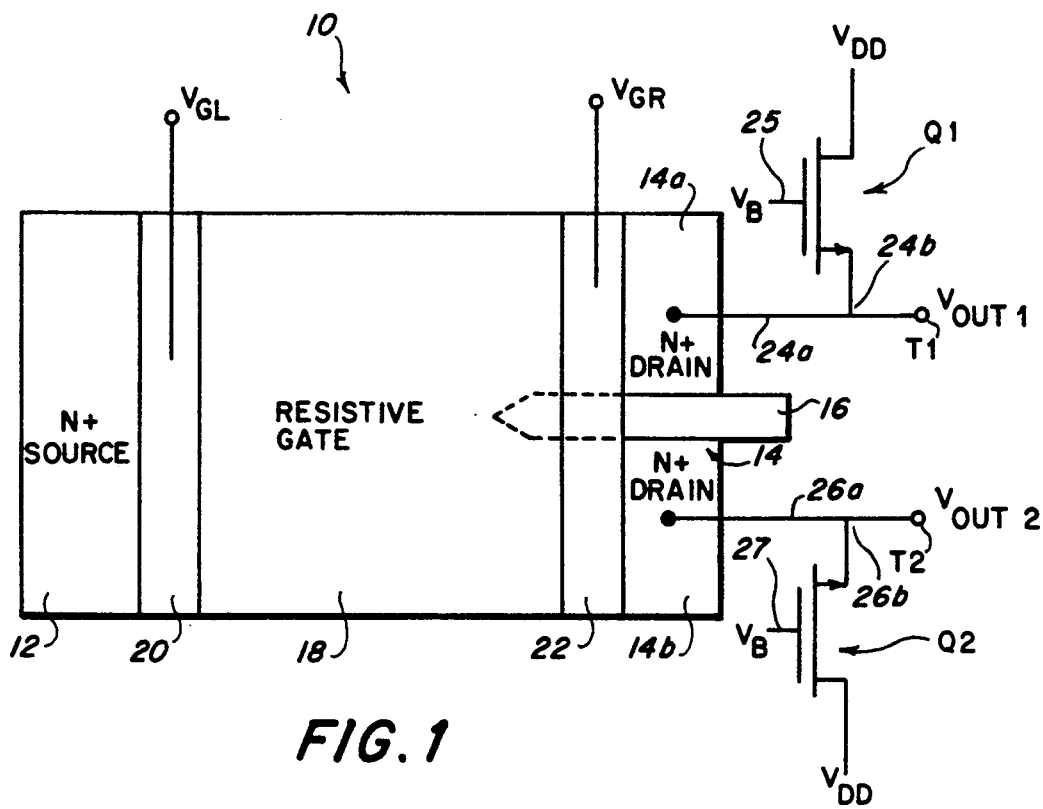
FIG. 1 is a top view of a resistive gate magnetic field sensor with split drains according to the invention, with output circuitry attached to each of the split drains.
Figure 2:
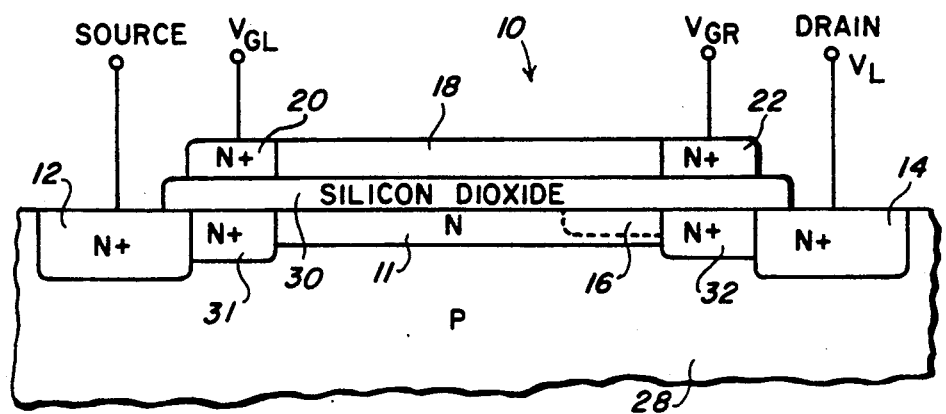
FIG. 2 is a cross-sectional view of the resistive gate magnetic field sensor of FIG. 1 with the source and drains self-aligned to the contacts to the resisitive gate.

Referring to FIGS. 1 and 2, a resistive gate MOSFET 10 comprises a P-type substrate 28 in which a buried channel conducting layer 11 is formed, at one end, a N+ source 12, and at a second, opposite end, a N+ drain or drain region 14 comprising split drains 14a and 14b (See FIG. 1). A charge splitter 16 which extends lengthwise on the MOSFET into the region of high longitudinal electric field beneath the resisitive gate shown in FIG. 1 is located in a region between the two drains and acts to repel charge buildup in and near the region between split drains 14a and 14b by means of increasing the threshold voltage in the region of the charge splitter 16.

Charge splitter 16 is typically formed of a P-type material which is heavily doped to form a P-type region in the substrate material as indicated by the dotted line region 16 in FIG. 2 in the area between drains 14a and 14b. A separation of several microns is needed between N+ drains 14a and 14b and the charge splitter 16 if a heavily doped P-type region is used for charge splitter 16 in order to prevent a low breakdown voltage for the drains 14a and 14b. Alternatively, charge splitter 16 can be formed by increasing the thickness of the silicon dioxide underlayer in order to increase the threshold voltage.

Between source 12 and split drains 14a and 14b is a resistive gate 18 having a first gate contact 20 connected to receive a bias voltage $V_{GL}$ and disposed at the left (as viewed in FIG. 1) end of resistive gate 18, i.e., the end closest to source 12, and a second gate contact 22 connected to receive a bias voltage $V_{GR}$ and disposed at the right end of resistive gate 18, i.e., the end closest to split drains 14a and 14b.

A first output connection 24a, providing an output signal $V_{OUT1}$ is connected between split drain 14a and output terminal T1 and is also connected by a connection 24b to the emitter follower output of a MOSFET amplifier Q1. MOSFET amplifier Q1 has its source connected to a supply voltage $V_{DD}$ and has its gate input, dubbed 25, connected to a bias voltage $V_B$. Similarly, a second output connection 26a, providing an output signal $V_{OUT2}$, is connected between split drain 14b and an output terminal T2 and is also connected by a connection 26b to the emitter follower output of a MOSFET amplifier Q2 which also has its source connected to a supply voltage $V_{DD}$ and its gate input, dubbed 27, connected to a bias voltage $V_B$.

Referring to FIG. 2, which is, as noted above, a cross-sectional view of the resistive gate MOSFET 10 of FIG. 1, with output MOSFET amplifiers Q1 and Q2 omitted for purposes of simplicity, there is shown a layer of silicon dioxide 30 on the top surface of the substrate material 28, with the buried channel conducting layer 11, through which movement of electron charges occur between source 12 and drain 14, being formed in substrate 28.

The resistive gate 18 is formed by a polysilicon layer that is typically produced using a silicon-based microelectronic technology, using undoped or lightly doped polysilicon. The polysilicon is typically heavily doped at left gate contact 20 and right gate contact 22 by ion implantation. Source and drain extensions 31 and 32, that are respectively aligned to left gate contact 20 and right gate contact 22 can be formed at the same time as the implant for the heavily doped gate contacts 20 and 22 by using a high energy ion implantation process in which contacts 20 and 22 and the extensions of source and drain regions 31 and 32 are formed using the same masking step.

Figure 5:
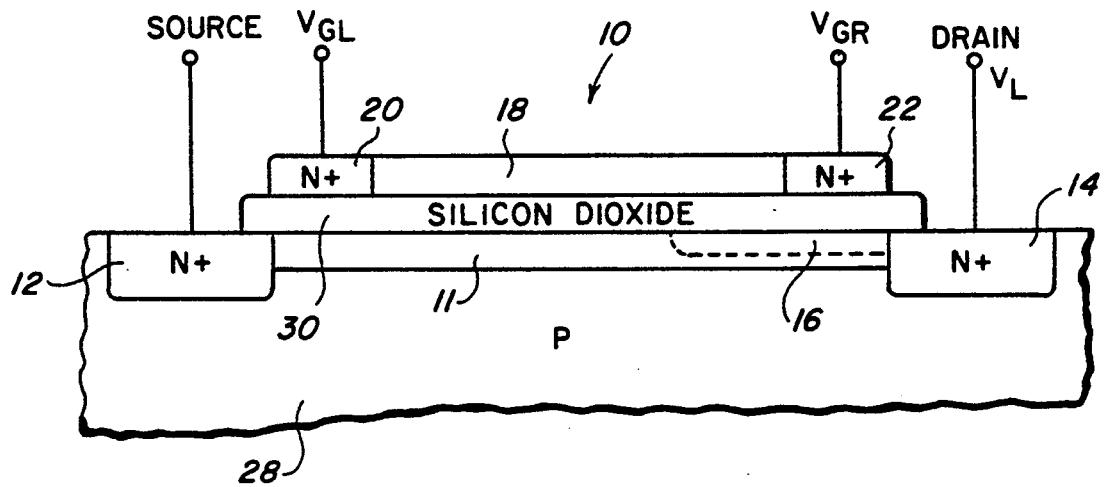
FIG. 5 is a cross-sectional view of the resistive gate magnetic field sensor with the source and drain not self-aligned to the resistive gate contacts.

The resistive gate magnetic field sensor performance should be approximately the same even if the source 12 and drain 14 are not self-aligned to the resistive gate contacts 20 and 22 as shown in FIG. 1. In the embodiment shown in FIG. 5, the source 12 and drain 14 are aligned to the polysilicon but not to the lightly doped polysilicon at the edge of contacts 20 and 22. From equation (1), the important parameters in causing deflection of electrons from a direction from the source to the drain are the longitudinal electric field $E_Y$ and the magnetic field in the z direction $B_Z$. Also from equation (1) the amount of deflection of the electrons is proportional to the strength of the magnetic field $B_Z$. If the resistive gate lengths are the same for the embodiments shown in FIGS. 2 and 5 and the same bias are applied, then the longitudinal electric field will be the same for the two embodiments and the carrier will be affected by this electric field over the same path length.

The MOSFET sensor 10 uses a buried channel conducting layer 11. The buried channel transport structure is important to obtain improved mobility and also a lower 1/f noise. The buried channel device structure for an N-channel silicon MOSFET is formed by a low dose of phosphorous or arsenic implant ($1E12/cm^2$ dose) into a P-type substrate 28 prior to gate deposition. An alternative would be to use a surface channel transport structure but this however, would not offer the improved mobility or lower 1/f noise benefits found in the buried channel structure.

Since the charge carrier deflection is proportional to the mobility $\mu$ of the carriers, in accordance with equation (1) above, it is very desirable to employ a structure providing high mobilities in the channel layer, such as a Gallium Arsenic (GaAs) based material or another high electron mobility material, e.g. Indium Antimony (InSb). Also, heterostructure devices, such as the Gallium Arsenic/Gallium Aluminum Arsenic (GaAs/GaAlAs) High Electron Mobility Transistor (HEMT) are desirable in providing extremely high mobilities. The GaAs/GaAlAs HEMT device has exhibited mobilities from several hundred thousand to $1E6$ $cm^2/vsec$. These mobilities are two to three orders of magnitude larger than the silicon electron mobility. Thus, one would expect the HEMT device to have approximately two to three orders of magnitude of improved sensitivity. The minimum detectable magnetic field therefore expected for a HEMT device is from 1–10 milliGauss. Resistive gates on GaAs have also been fabricated using cermet materials. (See J. Song and E. R. Fossum, IEEE Trans. on Electron Devices, Vol. 36, pages 1,575–1,579 (September 1989).)

Figure 6:
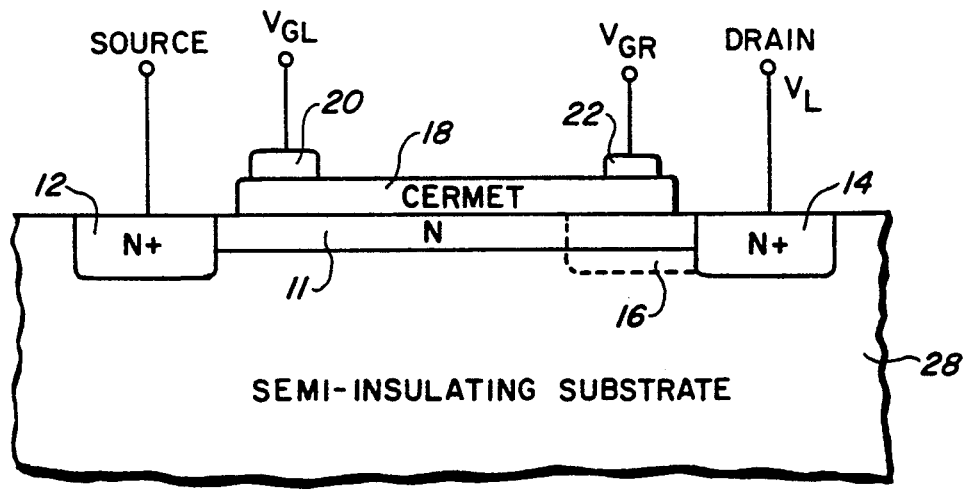
FIG. 6 is a cross-sectional view of a resistive gate magnetic field sensor implemented in GaAs or other column III–column V material.

MISFETs have been fabricated on GaAs material using wide bandgap, undoped AlGaAs as the insulating material and on other III-V material using dielectric insulators. However, a more common method of fabricating FET devices in GaAs and other III-V materials is to implement MESFET devices. FIG. 6 is a cross sectional view of an embodiment of a MESFET resistive gate magnetic field sensor implemented on GaAs. The cermet resistive gate layer 18 lies directly on the semiconductor material. Resistive gate contacts 20 and 22 are deposited metal on top of the cermet. The charge splitter 16 which prevents the buildup of charge between drains 14a and 14b is implemented by proton ion or oxygen ion implantaion which damages the material in the region of the ion implantation so that conduction of carriers cannot occur in the area of the ion implantaton. The buried channel conducting layer 11 is implemented by a N-type implantation into a semi-insulating GaAs substrate. The device structure for a High Electron Mobility Transister (HEMT) is almost identical to this structure except that the buried channel conducting layer 11 will be at the interface of a heterostructure consisting of a wide bandgap AlGaAs material and a GaAs material.

Figure 3:
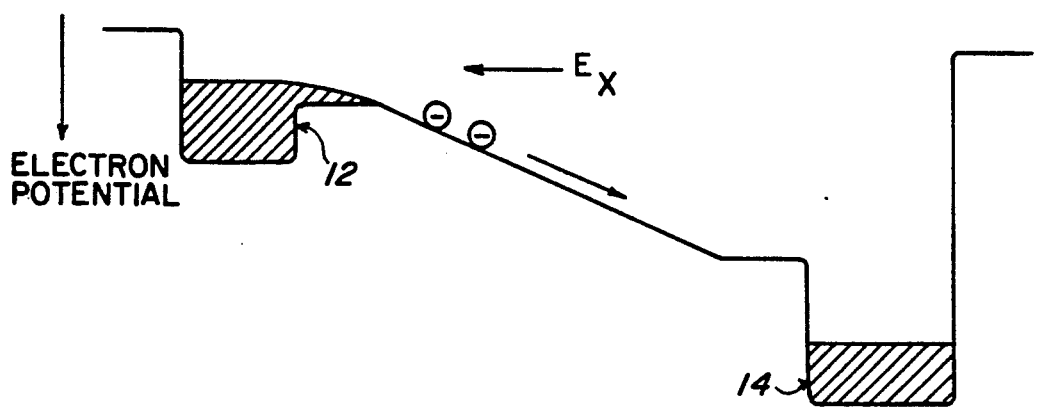
FIG. 3 is an illustration of the electron potential difference existing between the source and the drain of the sensor of FIG. 2 and the resultant charge carrier flow.

Turning now to operation of the preferred embodiment of the device as shown in FIG. 1, a uniform longitudinal electric field is provided in the buried channel conducting layer area between source 12 and drain 14. The variation in surface potential in the region beneath resistive gate 18 is illustrated in FIG. 3, showing electron flow from source 12 to drain 14 based on the longitudinal electric field $E_X$ existing between source 12 and drain 14 as established by the bias voltage difference beteen resistive gate contacts 20 and 22.

Considering the y direction to be the width of the sensor, the x direction to be the length of the sensor running from source to drain and the z direction to be the direction of the magnetic field impinging generally perpendicularly onto the top surface of the sensor, the carrier deflection in the y-direction is proportional to the longitudinal electric field in the x-direction, $E_X$, in accordance with equation (1) above. A higher longitudinal electric field is obtained throughout a length L of the channel region by using the resistive gate approach according to the invention. The longitudinal electric field $E_X$ is given approximately by:

$$E_x \approx \frac{V_{GR} - V_{GL}}{L} \qquad (8)$$

where $V_{GL}$ and $V_{GR}$ are gate voltages that are applied to the left and right gate contacts 20, 22, respectively. The drain bias voltage, $V_D$, required to obtain a uniform electric field in the channel must satisfy the requirement that:

$$V_D > V_{GR} - V_t \qquad (9)$$

The longitudinal electric field established by resistive gate 18 does not depend on the magnitude of $V_{GL}$, but only on the difference in voltage between $V_{GL}$ and $V_{GR}$. Thus, $V_{GL}$ can be operated close to the threshold voltage, $V_t$, and therefore, as appears from Equation (4), the carrier density in the channel can be low. The resistive gate has the unique aspect that it simultaneously allows a high longitudinal electric field value allows a high longitudinal electric field value and a small carrier density in the channel. This is in contrast with the conventional MOSFET operating in the triode mode which requires high carrier densities in order to obtain high longitudinal electric field values. As discussed above, low carrier densities are more beneficial in providing low thermal noise current and a resulting higher relative sensitivity in the use of the MOSFET as a magnetic field sensor.

A comparison of the magnetic field sensor of the invention with other known resistive gate MOSFET sensors, and in particular, with the GFET sensor described in the above-mentioned publication by B. S. Gill et al, further demonstrates the advantages that are realized with the sensor of the present invention. More specifically, the construction of the prior art GFET device had a separation of approximately 100 μm between the resistive gate contacts. In comparison, the sensor device of the invention requires only a separaton between resistive gate contacts 20 and 22 of approximately 10 μm. This results in providing a higher longitudinal electric field $E_X$, and thus increases sensitivity from Equaion (1), for similar resistive gate bias values. The bias voltage across gate contacts 20, 22 of 2 volts for a 10 μm gate length will provide a similar magnitude of sensitivity improvement as observed in the device discussed in the referenced article, with a 19 volt differential bias. A bias voltage across gate contacts 20, 22 of 10 volts should provide approximately a factor of 5 additional sensitivity improvement.

The use of low carrier densities as provided for in the present invention gives the added benefit of allowing for use of a high impedance load device based on the source-follower operation, as shown by use of MOSFET amplifiers Q1 and Q2 at the outputs in FIG. 1. The impedance of the source-follower load device with current levels in the sub-threshold region is given by:

$$R_L = \frac{1}{gm} \approx \frac{kT}{eI_D} \qquad (10)$$

where $R_l$ is the load resistance, k is the Boltzman constant, T is the absolute temperature and $I_D$ is current density. Thus, a small current level can yield extremely high load impedances, and a large voltage response results from a current change caused by a deflection of charge carriers in the split-drain magnetic field sensor device.

The use of charge splitter 16 between split drains 14a and 14b, as shown in FIGS. 1 and 2, prevents charge build-up in the area of charge splitter channel 16. Further, a floating gate current sensor, as described in a companion application earlier referenced herein, can be used as a load device for a split-drain resistive gate magnetic field sensor. In this usage, i.e., with such a floating gate current sensor as the load device the resistive gate also operates best at low currents.

A conventional MOSFET sensor operates, for example, with a drain bias voltage $V_D$ of 2 volts and a gate voltage $V_G$ of 5 volts. For a gate length L of 10 μm, the electric field from equation (2) is approximately 2E3 volt/cm. The drain current would be quite high because of the high gate voltage. In contrast, with the resistive gate MISFET as a magnetic field sensor, the bias across gate contacts 20, 22 is about 10 volts as mentioned above, and for a channel length L of 10 μm, the electric field would be approximately 1E4 volt/cm. Thus, the resistive gate device offers approximately five times greater electric field, and thus five times the capability of deflecting carriers. The drain current can be arbitrarily small by biasing the left gate voltage $V_{GL}$ near the threshold voltage $V_t$. There is provided, therefore, sensitivity improvement by a factor of approximately five in terms of minimum detectable magnetic field because of the increased electric field in the channel, as well as some improvement in noise level because of the smaller drain current. The reduced drain current also contributes to a significant improvement in the relative sensitivity, $S_r$, of the sensor device. Thus while MOSFET magnetic field sensors typically can detect magnetic fields down to 10 milliGauss, the resistive gate sensor according to the invention may have a minimum detectable magnetic field as low as approximately 1 milliGauss.

Figure 4:
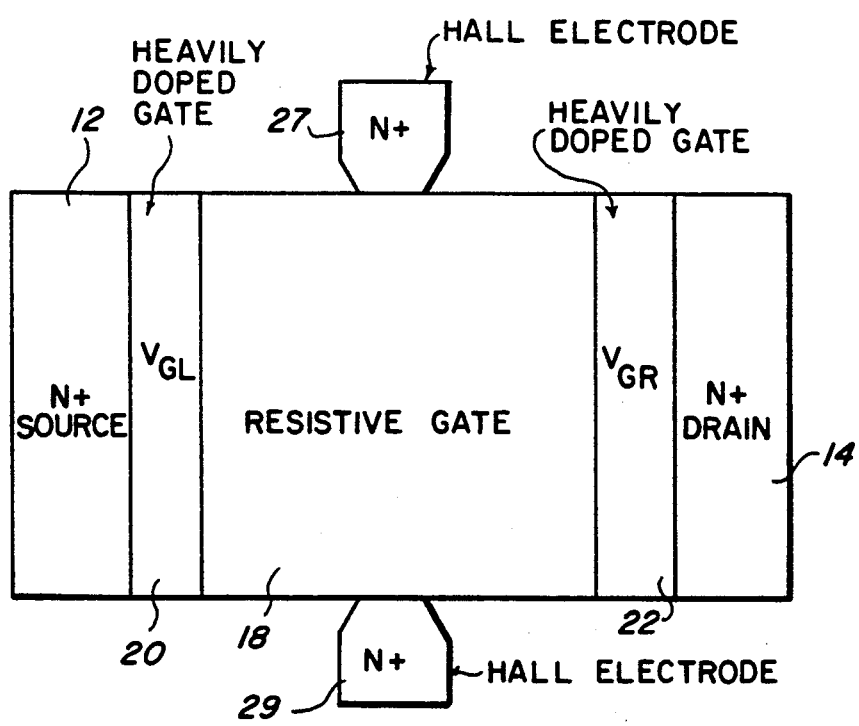
FIG. 4 is a beam view of a MOSFET resistive gate Hall effect magnetic field sensor according to an alternative embodiment of the invention.

FIG. 4 shows a top view of an alternative embodiment of the MISFET magnetic field sensor, viz. a MISFET resistive gate Hall effect sensor wherein electrodes 27 and 29 are placed on either side of resistive gate 18, and the output is taken from the signal developed at Hall electrodes 27,29. This replaces the split drain structure shown in FIG. 1.

It will be understood that the concept of using a resistive gate to establish a uniform longitudinal electric field in the MISFET channel is applicable to MISFET Hall effect type of magnetic field sensors wherein the output is taken from voltage signals produced at Hall electrodes on the opposite sides of the resistive gate, as shown in FIG. 4, and to the split-drain type of sensor wherein the outputs are taken from the split drains of the sensor device, as shown in FIG. 1. The resistive gate has also been found to be beneficial in removing the source short-circuit effect, an adverse effect that occurs in MOSFET sensors and is discussed in more detail in the publication by Popovic, referenced earlier herein.

It will be understood by those skilled in the art that although the invention has been described in relation to exemplary embodiments thereof, variations and modifications can be effected in these exemplary embodiments without departing from the scope and spirit of the invention.

I claim:

1. A FET device for sensing a magnetic field, said FET device comprising:
   a semiconductor material having a source at a first position therein and receiving means at a second position therein for receiving charge carriers;
   bias voltage means for providing a bias voltage between said source and said receiving means to produce a movement of charge carriers in a direction between said source and said receiving means;
   a channel layer disposed within said semiconductor material between said source and said receiving means through which said charge carriers move in said direction as a function of said bias voltage, and said magnetic field being sensed having a strength and producing a deflection of said charge carriers from said direction, which deflection varies as a function of the strength of said magnetic field being sensed;
   a resistive gate having first and second resistive gate contacts respectively disposed at first and second ends of said resistive gate, said resistive gate disposed between said source and said receiving means and above said channel layer;
   resistive gate voltage means for providing a resistive gate bias voltage between said first and second resistive gate contacts to establish a longitudinal electric field in said channel layer; and
   output means coupled to said receiving means for providing a signal related to the deflection of the charge carriers that is produced by the strength of the magnetic field sensed by said FET device.

2. The FET device of claim 1 wherein:
   said resistive gate is located above said channel layer;
   said first resistive gate contact is disposed in a portion of said resistive gate nearest to said source; and
   said second resistive gate contact is disposed in a portion of said resistive gate nearest to said receiving means.

3. The FET device of claim 1 wherein:
   said receiving means includes first and second drains adjacently positioned at said second preselected position, said first and second drains respectively having first and second outputs, and said second preselected position is on a side of said second resistive gate furtherest away from said source; and
   said output means is coupled to said first and second outputs for providing the signal related to the deflection of the charge carriers that is produced by the strength of the magnetic field being sensed by the FET device.

4. The FET device of claim 3 further including:
   charge splitter means, disposed between said first and second drains and extending into a region of high longitudinal electric field in said channel layer beneath said resistive gate, for preventing charge carrier buildup in and near the region between said first and second drains.

5. The FET device of claim 4 wherein:
   said charge splitter means is selected from the group consisting of a region of heavily doped P-type material, a region of thicker insulator and a region of proton ion damaged semiconductor material, for the prevention of charge carrier buildup in and near the region between said first and second drains.

6. The FET device of claim 4 wherein said output means includes:
   means coupled to said first and second drains for producing a signal related to the deflection of the charge carriers that is produced by the strength of the magnetic field sensed by the FET device.

7. The FET device of claim 3 wherein:
   said source and drains are self aligned to said resistive gate disposed beneath said first and second resistive gate contacts.

8. The FET device of claim 3 wherein:
   said output means comprises a MOSFET source follower load connected to each of said first and second drains.

9. The FET device of claim 3 wherein:
   said first and second resistive gate contacts are disposed at said first and second preselected positions and substantially between said source and said drains.

10. The FET device of claim 1 wherein:
    said semiconductor material is selected from the group consisting of a silicon semiconductor material, a GaAs semiconductor material, a column III–column V material, and a combination thereof.

11. The FET device of claim 1 wherein:
    said resistive gate is comprised of a material selected from the group consisting of cermet, lightly doped polysilicon and undoped polysilicon.

12. The FET device of claim 1 wherein:

said channel layer is a heterostructure consisting of a semiconductor material of one bandgap and a second semiconductor material of a wider bandgap.

13. The FET device of claim 1 wherein:

a first portion of said semiconductor material is an N-type layer of semiconductor material and a second portion of said semiconductor material is selected from the group consisting of a P-type semi-insulating semiconductor material and a semi-insulating semiconductor material; and said channel layer is disposed within said N-type layer of semiconductor material.

14. The FET device of claim 1 further including:

an insulating layer disposed between said semiconductor material and said resistive gate.

15. The FET device of claim 14 wherein:

said insulating layer is selected from the group consisting of silicon dioxide, silicon nitride, a wide bandgap semiconductor material, and a combination thereof.

16. The FET device of claim 1 wherein:

each of said first and second resistive gate contacts is selected from the group consisting of ohmic metal and heavily doped polysilicon.

17. A FET device for sensing a magnetic field, said FET device comprising:

a semiconductor material having a source at a first position therein and receiving means at a second position therein for receiving charge carriers;

bias voltage means for providing a bias voltage between said source and said receiving means to produce a movement of charge carriers in a direction between said source and said receiving means;

a channel layer disposed within said semiconductor material between said source and said receiving means through which said charge carriers move in said direction as a function of said bias voltage, and said magnetic field being sensed having a strength and producing a deflection of said charge carriers from said direction, which deflection varies as a function of the strength of said magnetic field being sensed;

a resistive gate having first and second resistive gate contacts respectively disposed at first and second ends of said resistive gate, said resistive gate disposed between said source and said receiving means and above said channel layer;

resistive gate voltage means for providing a resistive gate bias voltage between said first and second resistive gate contacts to establish a longitudinal electric field in said channel layer; and output means comprising first and second electrode means, disposed in said semiconductor material and on opposite sides of said resistive gate, for producing output voltage signals related to the deflection of said charge carriers within said channel layer, which deflection is produced by the strength of the magnetic field sensed by said FET device.

18. The FET device of claim 17 wherein:

said channel layer is a heterostructure comprised of a semiconductor material of one bandgap and a second semiconductor material of a wider bandgap.

19. The FET device of claim 17 wherein:

a first portion of said semiconductor material is an N-type layer of semiconductor material and a second portion of said semiconductor material is a P-type semiconductor material; and said channel layer is disposed within said N-type layer of semiconductor material.

20. The FET device of claim 17 further including:

an insulating layer disposed between said semiconductor material and said resistive gate.

21. The FET device of claim 20 wherein:

said insulating layer is selected from the group consisting of silicon dioxide, silicon nitride, a wide bandgap semiconductor material, and a combination thereof.

22. The FET device of claim 20 further including:

a surface channel transport layer disposed in said semiconductor material and adjacent to said insulating layer.

* * * * *